(12) United States Patent
Hoss et al.

(10) Patent No.: US 7,746,655 B1
(45) Date of Patent: Jun. 29, 2010

(54) SYSTEM AND METHOD FOR ASSEMBLY OF A PROCESSOR AND SOCKET ON AN INFORMATION HANDLING SYSTEM PRINTED CIRCUIT BOARD

(75) Inventors: Shawn Hoss, Round Rock, TX (US); Steven Stubbs, Georgetown, TX (US); Thomas M. Wilson, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 33 days.

(21) Appl. No.: 12/336,171

(22) Filed: Dec. 16, 2008

(51) Int. Cl.
 *H05K 5/00* (2006.01)
(52) U.S. Cl. .................. 361/759; 361/732; 174/561
(58) Field of Classification Search .......... 361/759, 361/726, 732, 801–803; 174/561; 439/135–136, 439/149, 940
See application file for complete search history.

(56) References Cited

U.S. PATENT DOCUMENTS

| | | | |
|---|---|---|---|
| 5,955,700 A * | 9/1999 | Slipy et al. ................. | 174/50 |
| 6,049,458 A | 4/2000 | Lee et al. | |
| 6,785,146 B2 * | 8/2004 | Koike et al. ................. | 361/759 |
| 7,121,865 B2 | 10/2006 | Bryant | |
| 7,336,781 B2 * | 2/2008 | Hu et al. ................. | 379/433.11 |
| 7,367,822 B2 * | 5/2008 | Ma ........................... | 439/135 |
| 7,429,181 B2 * | 9/2008 | Liao ........................... | 439/135 |
| 7,429,182 B1 * | 9/2008 | Zheng et al. ................ | 439/135 |
| 7,708,571 * | 5/2010 | Terhune et al. .............. | 439/135 |

\* cited by examiner

*Primary Examiner*—Hung S Bui
*Assistant Examiner*—Andargie M Aychillhum
(74) *Attorney, Agent, or Firm*—Hamilton & Terrile, LLP; Robert W. Holland (57) ABSTRACT

A grid array socket pin field is protected during manufacture of an information handling system with a dust cap having first and second attachment devices. The first attachment device secures the cap to the socket during assembly of the socket in the computer. The second attachment device secures the cap to a load mechanism assemble proximate the socket. Engagement of the second attachment device to the cap automatically releases the cap from the socket to allow removal of the cap from the socket by actuation of the load mechanism to an open position. The second attachment device secures the cap to the load mechanism until a processor is placed in the socket.

6 Claims, 8 Drawing Sheets

SYSTEM AND METHOD FOR ASSEMBLY OF A PROCESSOR AND SOCKET ON AN INFORMATION HANDLING SYSTEM PRINTED CIRCUIT BOARD

BACKGROUND OF THE INVENTION

1. Field of the Invention

The present invention relates in general to the field of information handling system assembly, and more particularly to a system and method for assembly of a processor and socket on an information handling system printed circuit board.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Improvements in the processing capabilities of information handling systems have resulted from greater processing capability of components used to build information handling systems, such as central processing units (CPUs). Improved processing capabilities have depended on improved information transfer speeds to communicate information between information handling system components, such as the use of serial links like those compliant with the PCI Express standard. One improvement that has helped increase information transfer speeds is the use of land grid array (LGA) sockets to interface a processing component, such as a CPU, with a printed circuit board (PCB), such as a motherboard. LGA sockets include a socket having a pin field disposed to align with pins exposed on the underside of a processing component, thus providing an increased surface area for pin connections compared with conventional sockets that have pins disposed around the periphery of the processing component. The socket pin field is an array of spring contacts that are deflected and provide a contact normal force between the CPU substrate via gold pads on the substrate and the gold plated spring contacts. Deflection with springs provides a minimum contact pressure for good contact to CPU circuitry with minimal resistance. The pin fields have an appearance of an array of slightly cantilevered lever springs. A load mechanism is secured to the printed circuit board over the top of the socket so that a load plate of the load mechanism closes down on an inserted processing component to maintain an interface between the socket pin field and the processing component pins.

One difficulty with the use of grid array sockets, such as LGA sockets, is that the pin field of the socket can suffer damage by even minimal contact with a foreign object or contaminant. During manufacture of an information handling system, manufacturers must exercise care to avoid damage to socket pin fields, especially between the time of attachment of the socket to the printed circuit board and securing of the processor in the socket by a load plate of a load mechanism. To help avoid inadvertent damage to the grid array pin field, the socket is typically covered with a dust cap that is engaged over the grid array pin field immediately after manufacture of the socket. One recently proposed LGA socket presents a challenge since the socket and grid array pin field are assembled to the printed circuit board followed by the load mechanism, which is assembled around the periphery of the socket. After the load mechanism is assembled around the socket, the socket dust cap is removed, the processor is put into place, and the load mechanism is activated so that the load plate holds the processor in place. Inadvertent damage can occur to the socket pin field during removal of the dust cap, such as by dropping the dust cap on the pin field or dragging the dust cap across the pin field.

SUMMARY OF THE INVENTION

Therefore a need has arisen for a system and method which protects a grid array socket from damage during assembly of an information handling system.

In accordance with the present invention, a system and method are provided which substantially reduce the disadvantages and problems associated with previous methods and systems for protecting a grid array socket from damage during assembly of an information handling system. A cap covers the socket during manufacture of the information handling system. Once a load mechanism is assembled proximate the socket, the load mechanism interacts with the cap to release the cap from the socket and raise the cap away from the socket for installation of a processor in the socket.

More specifically, a grid array socket is assembled to a motherboard. A dust cap covers the pin field of the socket to prevent damage to the pin field. The cap couples to the socket by interaction of an attachment device of the cap and an attachment point at the socket. A load mechanism is assembled proximate the socket, the load mechanism designed to hold a processor in the socket. A load plate of the load mechanism is assembled in a closed position over the socket or assembled in an open position and then moved to a closed position over the socket. An attachment device of the cap couples to the load plate when the load plate is in the closed position to secure the cap to the load plate. Interaction of the load plate and the cap's load plate attachment device automatically releases the cap's socket attachment device so that the cap is free from the socket. For example, the attachment device is an arm having a socket attachment device at one end and a load plate attachment device at an opposing end. Closing the load plate over the cap flexes the arm at the load plate attachment device to translate a release force to the socket attachment device. Once the cap is coupled to the load plate, the load plate is actuated to an open position to lift the cap from the socket and expose the socket pin field for installation of a processor in the socket. The load plate holds the cap until after installation of the processor so that removal of the cap does not result in the cap falling onto the socket pin field to damage the socket since the socket pin field is covered by the processor.

The present invention provides a number of important technical advantages. One example of an important technical advantage is that a socket is protected by a dust cap until after assembly of the socket on a printed circuit board, and then the dust cap is removed from the socket with minimal risk of damage by actuation of the load plate. Installation attachment features incorporated with the dust cap makes removal of the dust cap automatic by actuation of the load plate to an open position for installation of the processor. Removing the dust cap by interaction with the load plate limits the risk of damage to the grid array pin field of the socket since rotation of the load plate provides a lifting motion to the dust cap without dragging of the dust cap across the pin field. Coupling the dust cap to the load mechanism until after the processor is installed limits the risk that the dust cap will fall onto the grid array pin field until the pin field is protected by the installed processor. The dust cap aids with pick and place manufacture of printed circuit boards. The dust cap is pre-assembled to the socket so that a robotic arm uses the dust cap as a mean of attachment, such as with a suction cup. After all components are assembled and soldered to the motherboard, the load plate is then assembled with the socket pin field protected throughout the assembly process.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Automatically transferring attachment of a socket dust cap from the socket to a load mechanism aids in the assembly of an information handling system by preventing the cap from damaging a pin field of the socket. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of non-volatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
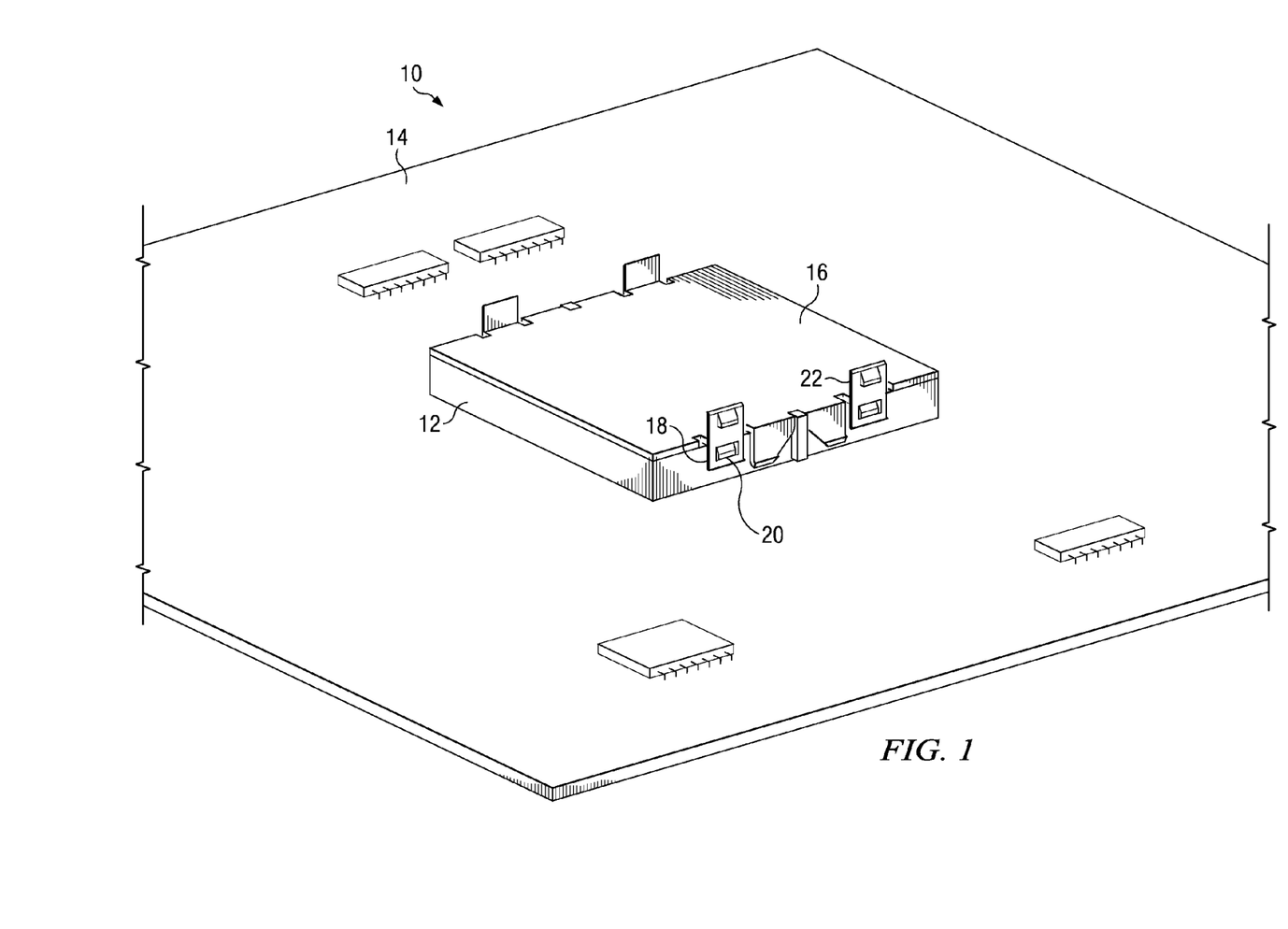
FIG. 1 depicts a side perspective view of an information handling system having a socket coupled to a motherboard, the socket covered with a dust cap.

Referring now to FIG. 1, a side perspective view depicts an information handling system 10 having a socket 12 coupled to a motherboard 14, the socket covered with a dust cap 16. Socket 12 is, for example, a Land Grid Array (LGA) socket or other type of socket that interacts with a processor through a grid array pin field. Socket 12 is coupled to motherboard 14 during manufacture of an information handling system to support communication between a processor inserted in the socket and other components coupled to the motherboard, such as RAM or a chipset. Cap 16 couples to socket 12 with a socket attachment device 18, which interacts with a socket attachment point 20. Cap 16 protects socket 12 during assembly of information handling system 10, such as by covering a pin field of socket 12. For example, a suction cup attaches to cap 16 so that a robotic arm can pick up socket 12 via cap 16 to place socket 12 at an appropriate location of motherboard 14. Socket attachment device 18 is an arm extending downward from cap 16 towards socket 12. Socket attachment device 18 has an opening that fits over socket attachment point 20 to hold cap 16 in place over socket 12. A load mechanism attachment device 22 extends upward from cap 16 on the opposing end of the arm forming socket attachment device 18. Load mechanism attachment device 22 is positioned to engage a load mechanism load plate that closes over socket 12. Engagement of load plate by attachment device 22 automatically release socket attachment device 18 to allow removal of cap 16 for insertion of a processor in socket 12. For example, cap 16 transfers from attachment to the socket to attachment to the load mechanism by designing the retention force of cap 16 to the socket to be less than the retention force of cap to the load mechanism. Different retention forces of cap 16 is accomplished in a number of ways, such as by a partial flexing of cap 16 relative to the socket or increasing the strength of snaps that hold cap 16 to the load mechanism.

Figure 2:
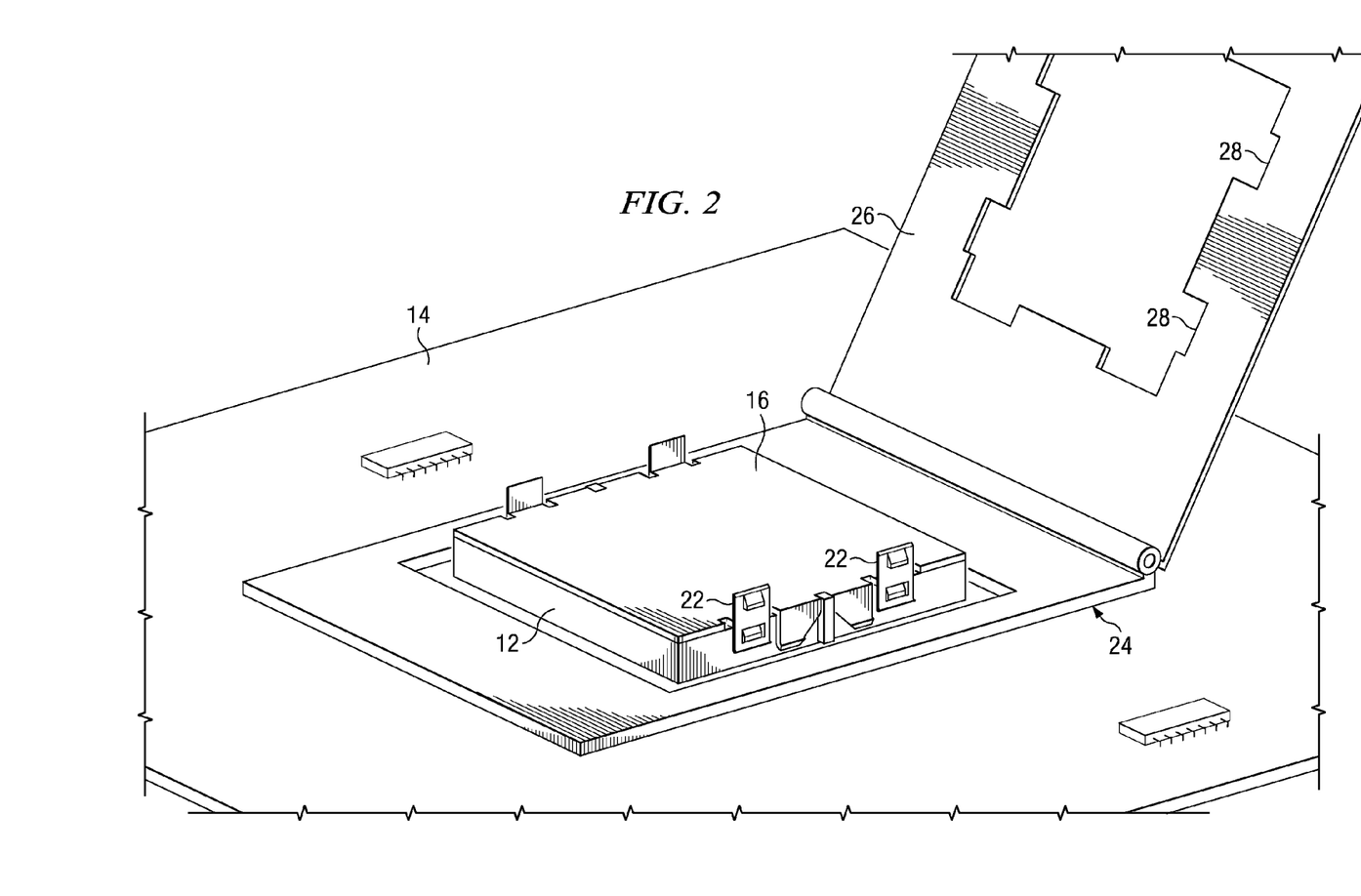
FIG. 2 depicts a load mechanism coupled to the motherboard proximate the socket.
Figure 3:
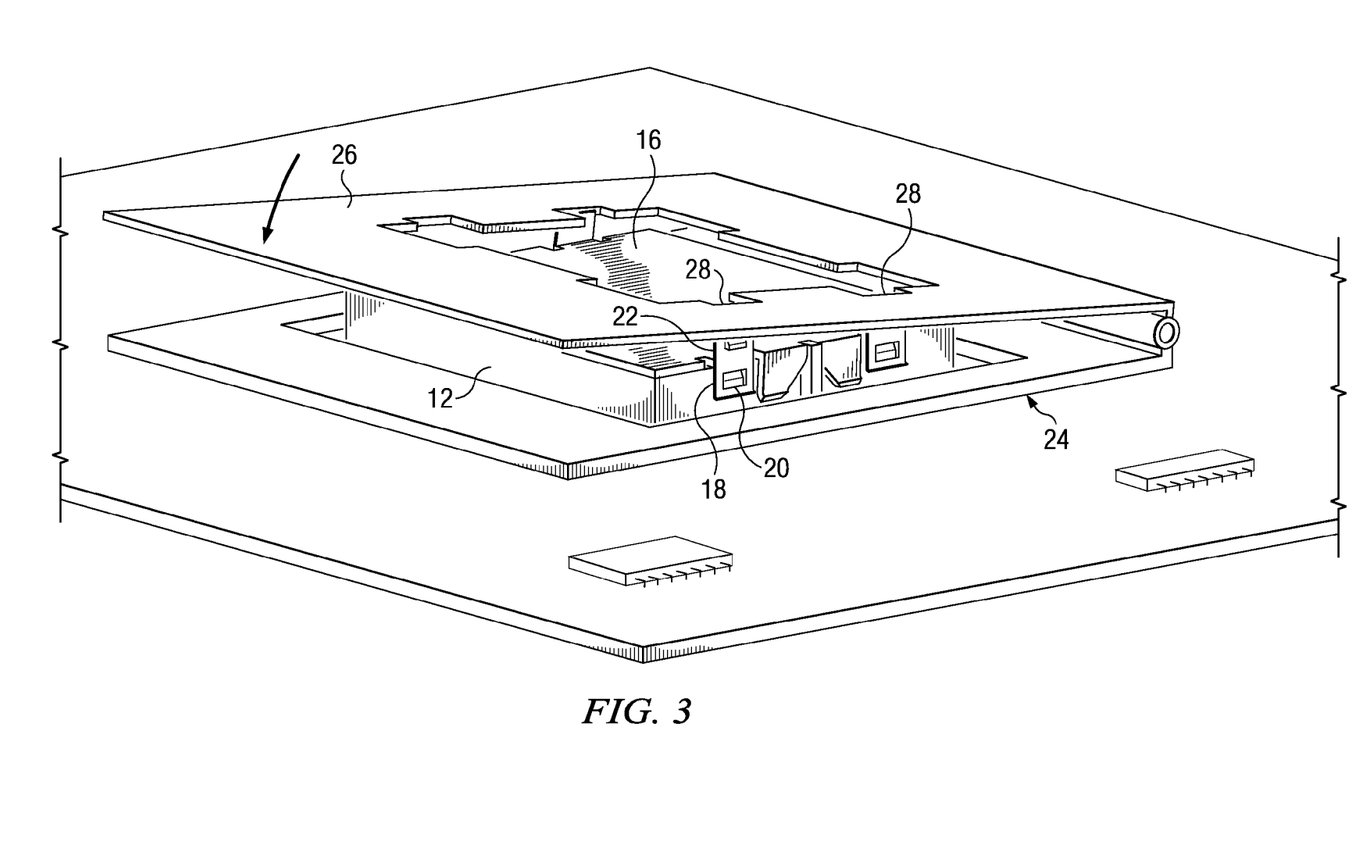
FIG. 3 depicts a load plate of the load mechanism closing over the socket.
Figure 4:
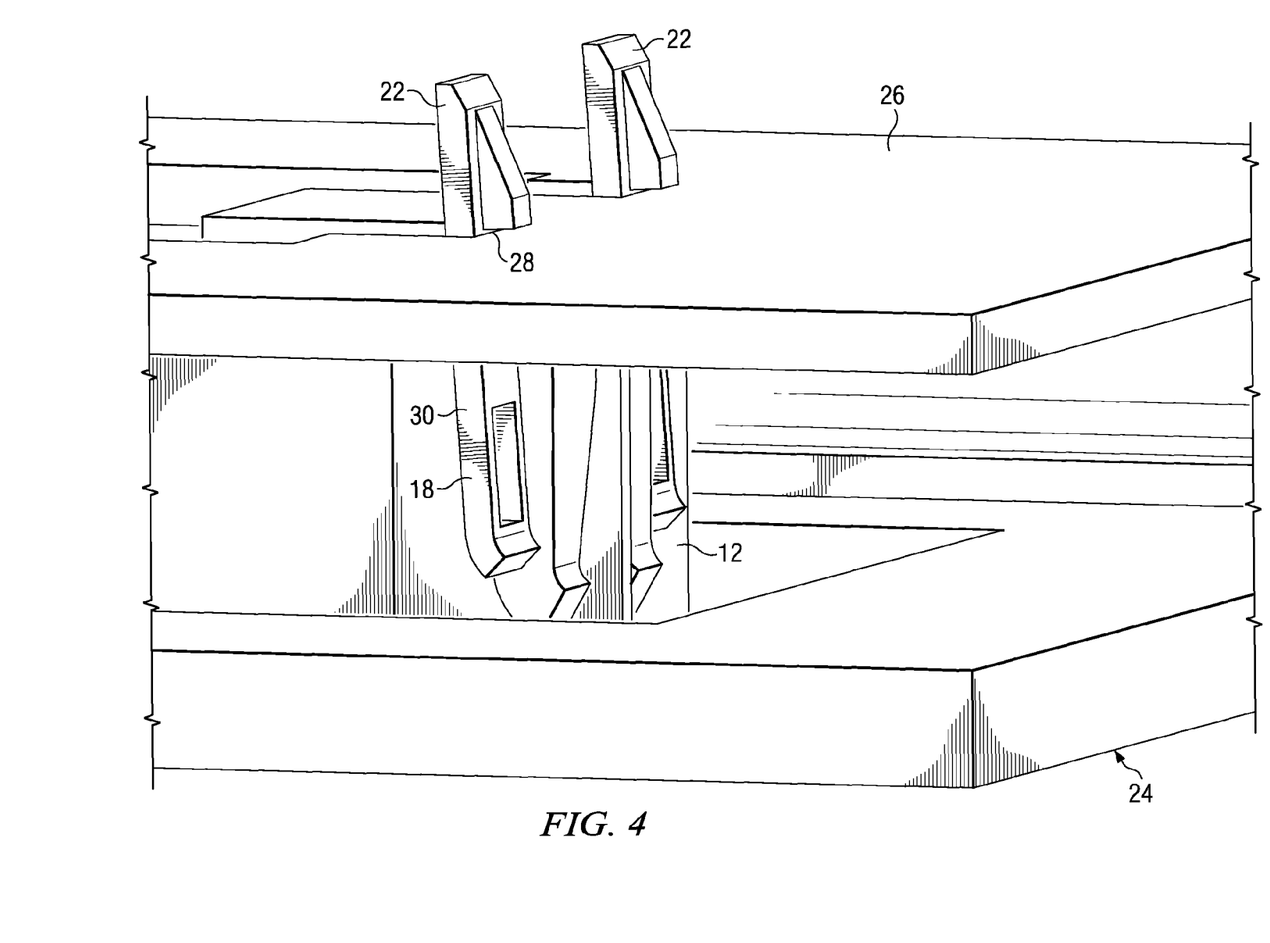
FIG. 4 depicts a side view of a load mechanism attachment device engaging the load plate and automatically releasing a socket attachment device.

Referring now to FIG. 2, a load mechanism 24 is depicted coupled to motherboard 14 proximate to socket 12. Load mechanism 24 has a hinged load plate 26 that rotates from the depicted open position to a closed position that secures a processor in socket 12. Load plate 26 has load mechanism attachment points 28 that are aligned with load mechanism attachment devices 22 when load plate 26 closes over a socket 12 having a cap 16. FIG. 3 depicts load plate 26 closing over socket 12 with a cap 16 coupled to socket 12 by interaction of socket attachment device 18 and socket attachment point 20. As load plate 26 lowers over cap 16, load mechanism attachment devices 22 contact load mechanism attachment points 28. Leverage applied by the interaction of load mechanism attachment device 22 and load mechanism attachment points 28 passes to the opposing end of the arm at socket attachment device 18, causing socket attachment device 18 to lift away from socket attachment points 20. FIG. 4 depicts a side view of the leverage applied through attachment device arm 30 so that coupling of load mechanism attachment device 22 to load mechanism attachment point 28 releases socket attachment device 18 from socket 12. Although FIGS. 3 and 4 depict load mechanism 24 coupled to motherboard 14 in an open position followed by closing of load plate 26 over socket 12, in alternative embodiments, load mechanism 24 may be attached to motherboard 14 with load plate 26 in a closed position.

Figure 5:
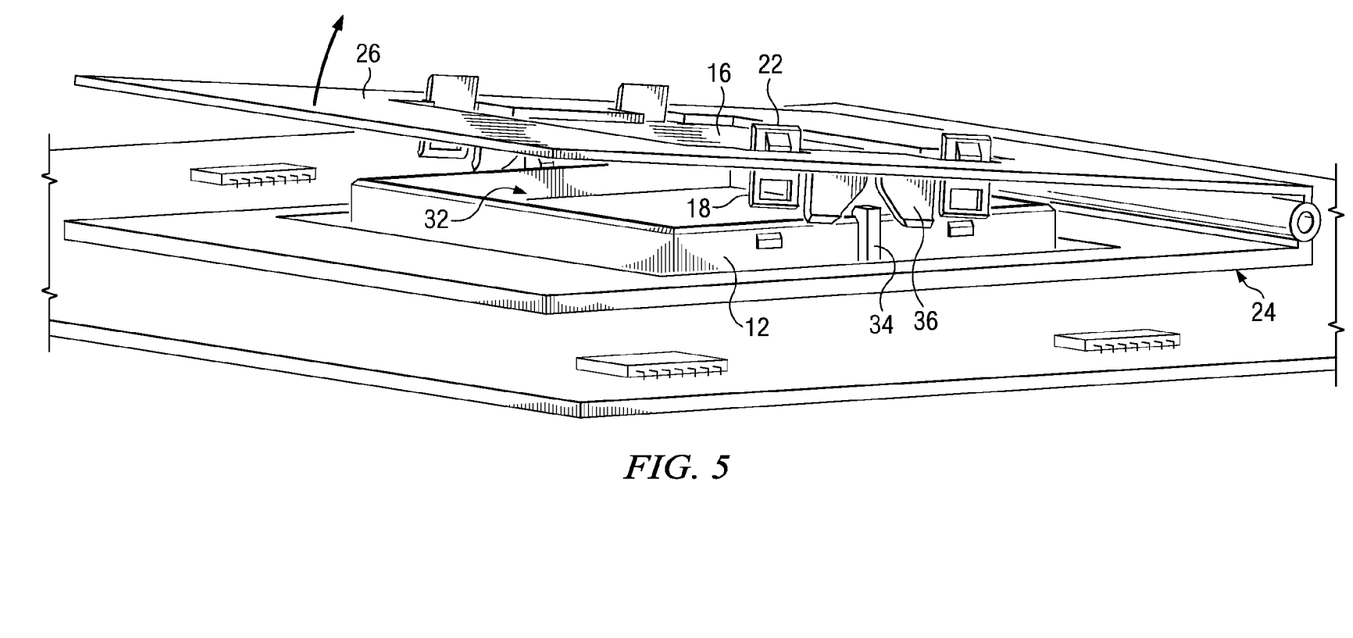
FIG. 5 depicts a side perspective view of a load plate actuation from a closed position to an open position to lift the cap from the socket.

Referring now to FIG. 5, a side perspective view depicts load plate 26 actuation from a closed position to an open position to lift cap 16 from socket 12. Lifting cap 16 from socket 12 exposes pin field 32, however, cap 16 is secured to load plate 26 to limit the risk of damage to pin field 32. Load mechanism attachment devices 22 secure cap 16 by flexing against load mechanism attachment points 28. Socket attachment devices 18 are released from socket 12 so that cap 16 lifts away from socket 12 with rotation of load plate 26 to an open position. As cap 16 lifts from socket 12, the interaction of a socket guide 34 and cap guide 36 becomes apparent. During assembly of cap 16 to socket 12, socket guide 34 interacts with cap guide 36 to aid in proper alignment of cap 16 over socket 12.

Figure 6:
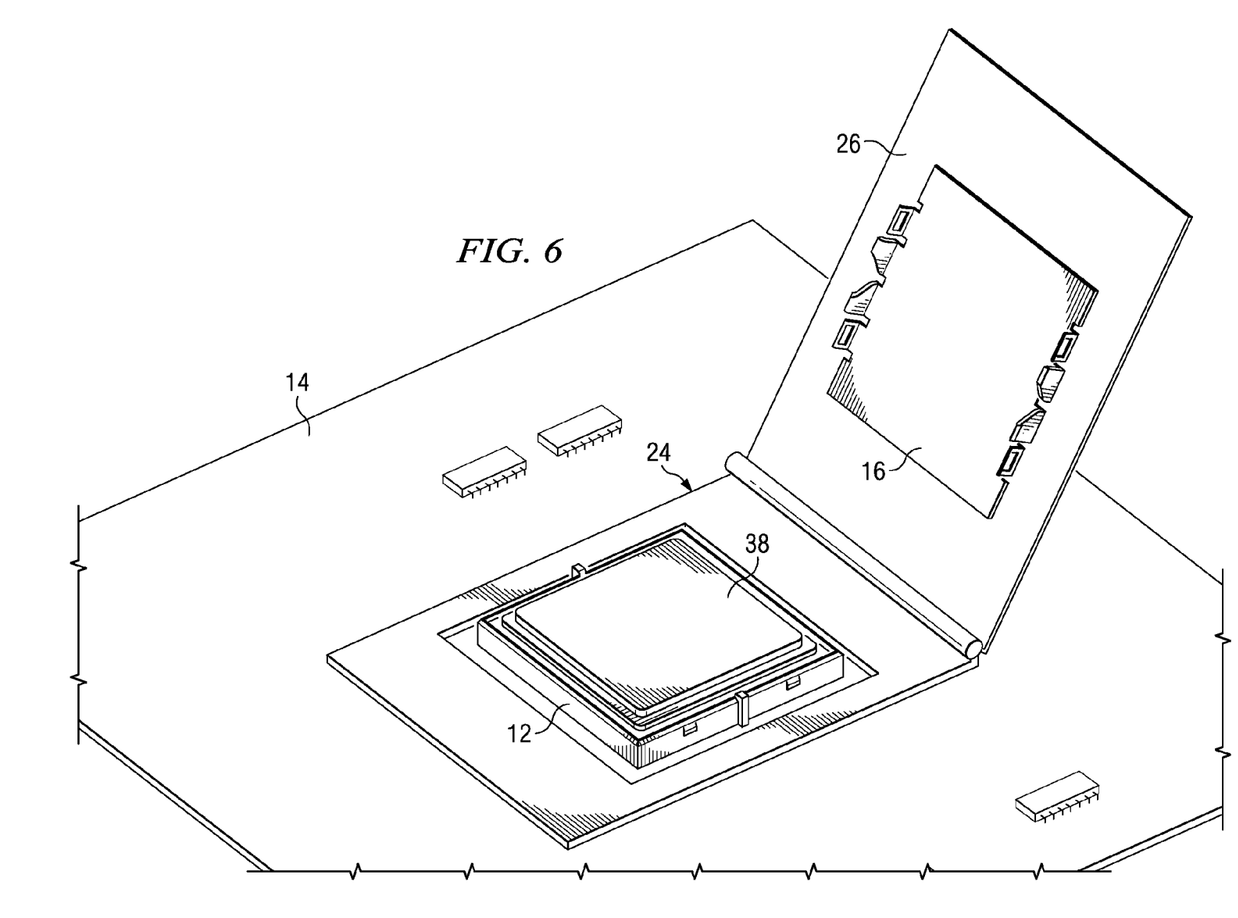
FIG. 6 depicts a CPU inserted into the socket while the load plate holds the cap away from the socket.
Figure 7:
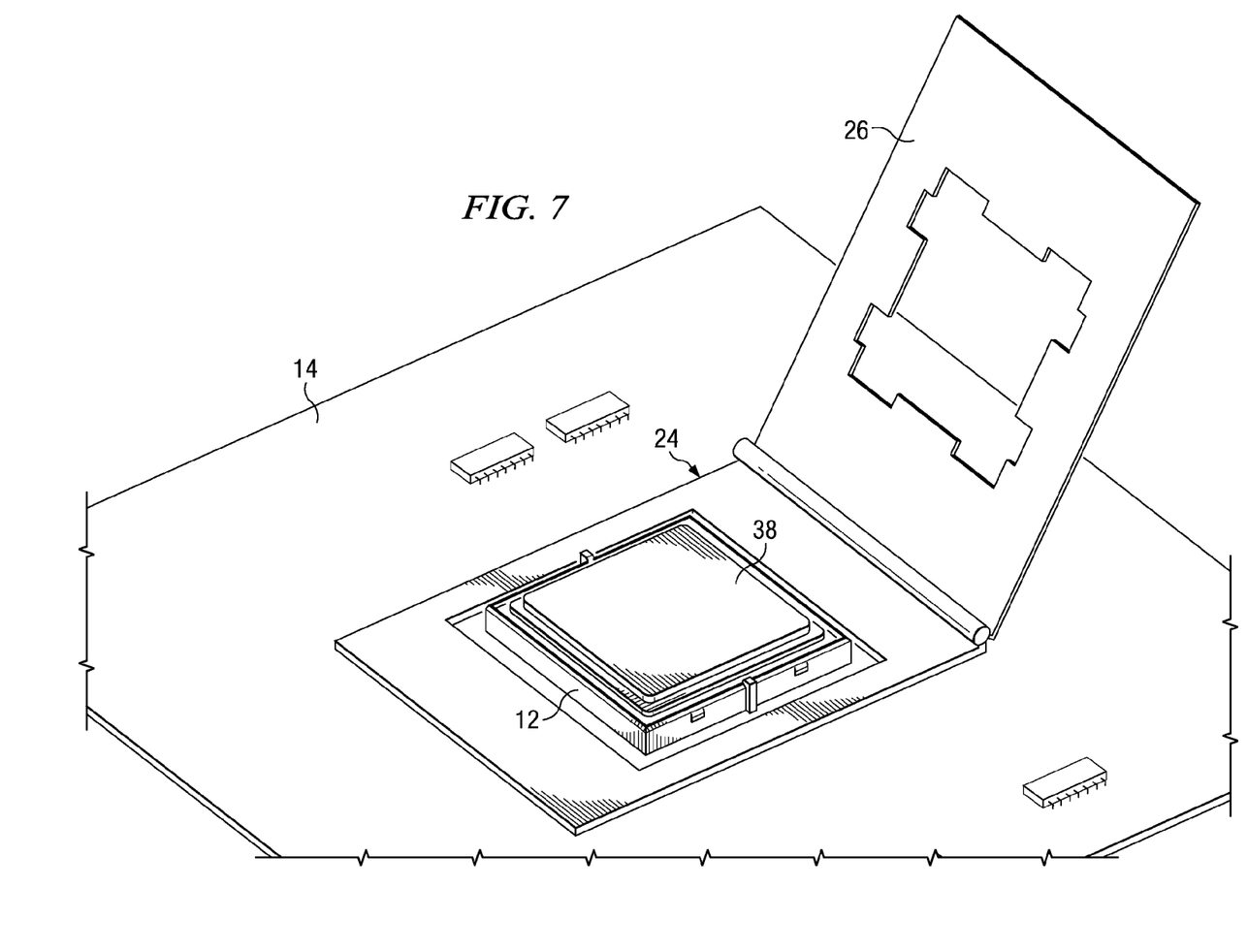
FIG. 7 depicts the cap removed from the load plate with the CPU in the socket.
Figure 8:
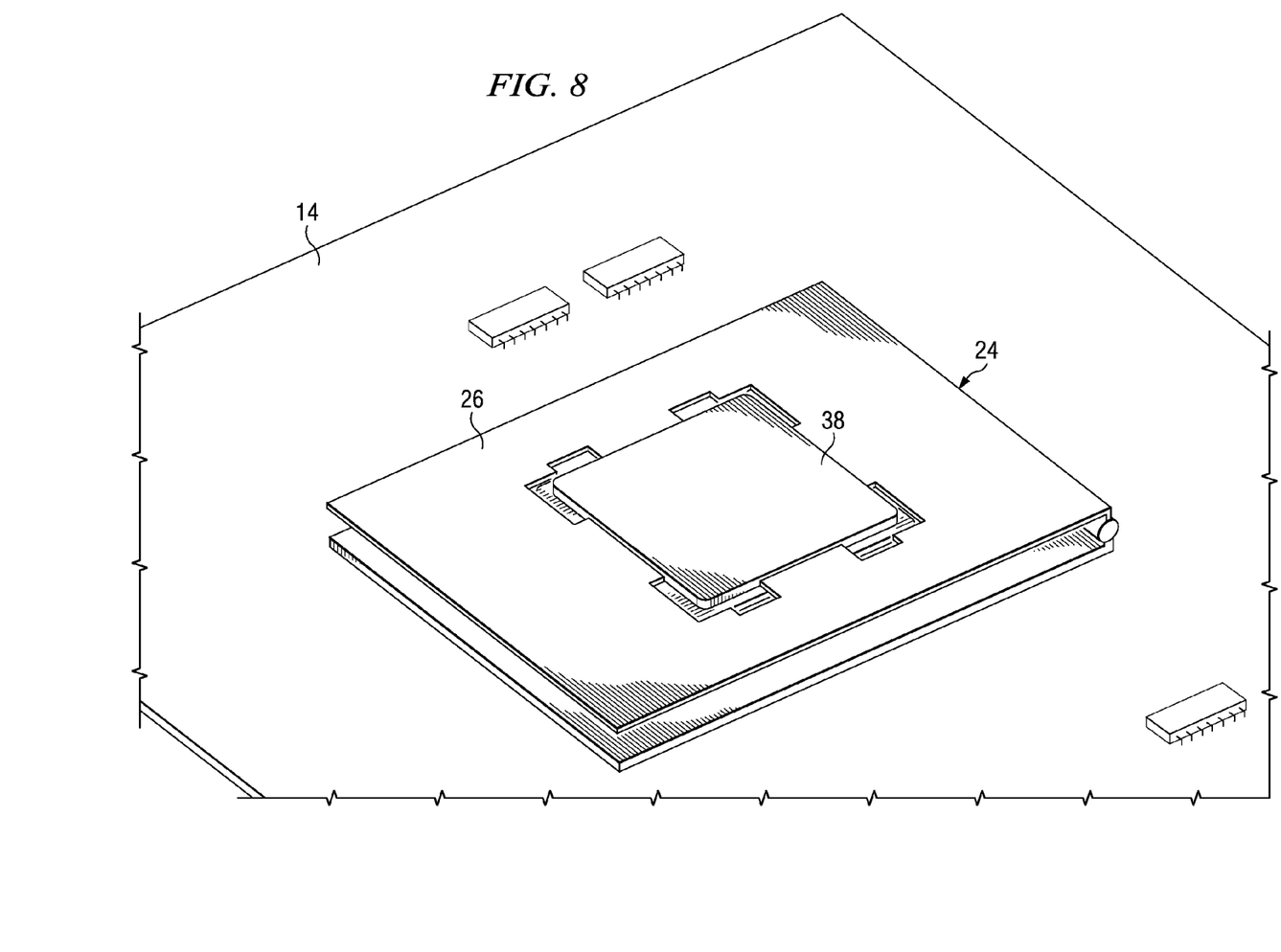
FIG. 8 depicts the load plate closed to secure the CPU in the socket.

Referring now to FIG. 6, a CPU 38 is depicted inserted into socket 12 while load plate 26 holds cap 16 away from socket 12. Inserting CPU 38 into socket 12 covers the pin field to protect socket 12 from damage while cap 16 remains securely coupled to load plate 26. Once CPU 38 is inserted into socket 12, cap 16 is removed from load plate 26 as is depicted by FIG. 7. The presence of CPU 38 in socket 12 prevents damage from cap 16 inadvertently falling on socket 12 with an exposed pin field. Once cap 16 is removed from load plate 26, load plate 26 is rotated to a closed position to secure CPU 38 in socket 12. Load mechanism 24 may be any device that secures a processor into a socket, such as a land grid array (LGA) socket or other types of sockets that accept a processor.

Although the present invention has been described in detail, it should be understood that various changes, substitutions and alterations can be made hereto without departing from the spirit and scope of the invention as defined by the appended claims.

What is claimed is:

1. A system for protecting a grid array socket comprising:
a cap sized to cover the grid array socket; a first attachment device associated with the cap and operable to couple the cap to the socket; and a second attachment device associated with the cap and operable to couple the cap to a load plate; wherein actuation of the second attachment device automatically releases the first attachment device; wherein the first and second arms comprise a common piece, the second arm aligned to engage the load plate as the load plate closes over the socket, the engagement of the second arm and load plate moving the first arm a sufficient distance to disengage the first arm from the socket; wherein the second arm forms a ramp that interacts with the load plate to move the first arm thereby releasing the first arm from the socket.

2. The system of claim 1 wherein the second attachment device actuates by closing the load plate over the cap.

3. The system of claim 1 wherein the first attachment device comprises a first arm extending from the cap towards the socket to couple at an attachment point of the socket.

4. The system of claim 1 further comprising a guide formed in the cap, the guide interacting with the socket to align the first arm with an attachment point of the socket.

5. The system of claim 2 wherein raising the load plate after actuation of the second attachment device lifts the cap from the grid array socket.

6. The system of claim 3 wherein the second attachment device comprises a second arm extending from the cap away from the socket to couple to an attachment point of the load plate.

\* \* \* \* \*